(12) United States Patent
Akashi et al.

(10) Patent No.: US 11,598,007 B2
(45) Date of Patent: Mar. 7, 2023

(54) SUBSTRATE STATE DETERMINING APPARATUS, SUBSTRATE PROCESSING APPARATUS, MODEL GENERATING APPARATUS, AND SUBSTRATE STATE DETERMINING METHOD

(71) Applicant: Tokyo Electron Limited, Tokyo (JP)

(72) Inventors: Nao Akashi, Sapporo (JP); Yuta Haga, Iwate (JP); Hiroyuki Sato, Iwate (JP); Motoi Okada, Sapporo (JP); Kei Sano, Sapporo (JP); Junya Sato, Sapporo (JP); Takayuki Kita, Sapporo (JP); Atsushi Suzuki, Sapporo (JP); Kiwamu Tsukino, Sapporo (JP); Takuro Tsutsui, Sapporo (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 713 days.

(21) Appl. No.: 16/549,365

(22) Filed: Aug. 23, 2019

(65) Prior Publication Data

US 2020/0080202 A1 Mar. 12, 2020

(30) Foreign Application Priority Data

Sep. 6, 2018 (JP) .............................. JP2018-167226

(51) Int. Cl.
*G06K 9/00* (2022.01)
*C23C 16/52* (2006.01)
(Continued)

(52) U.S. Cl.
CPC .......... *C23C 16/52* (2013.01); *C23C 16/4584* (2013.01); *C23C 16/46* (2013.01);
(Continued)

(58) Field of Classification Search
CPC ..... C23C 16/52; C23C 16/4584; C23C 16/46; G06N 3/08; G06N 20/00; G06T 7/001;
(Continued)

(56) References Cited

U.S. PATENT DOCUMENTS 5,124,931 A * 6/1992 Iwamatsu .......... G01R 31/2831
716/112
5,981,966 A * 11/1999 Honma ............. H01L 21/67259
414/172
(Continued)

FOREIGN PATENT DOCUMENTS

JP 2014-229861 A 12/2014
JP 2000-057349 A 2/2020
(Continued)

*Primary Examiner* — Samir A Ahmed
(74) *Attorney, Agent, or Firm* — Venjuris, P.C.

(57) ABSTRACT

According to an aspect of the present disclosure, a substrate state determining apparatus includes: an image capturing unit that captures an image of a substrate placed on a stage; a learning unit that executes a machine learning using training data in which information indicating a state of the substrate is attached to the image of the substrate, so as to generate a substrate state determination model in which the image of the substrate is taken as an input and a value related to the state of the substrate corresponding to the image of the substrate is taken as an output; and a determination unit that determines the state of the substrate corresponding to the image of the substrate captured by the image capturing unit, using the substrate state determination model generated by the learning unit.

17 Claims, 13 Drawing Sheets

(51) Int. Cl.
*C23C 16/458* (2006.01)
*C23C 16/46* (2006.01)
*G06T 7/73* (2017.01)
*G06N 3/08* (2023.01)
*G06T 7/00* (2017.01)
*H04N 5/247* (2006.01)

(52) U.S. Cl.
CPC ............... *G06N 3/08* (2013.01); *G06T 7/001* (2013.01); *G06T 7/74* (2017.01); *G06T 2207/20081* (2013.01); *G06T 2207/30148* (2013.01); *H04N 5/247* (2013.01)

(58) Field of Classification Search
CPC ............. G06T 7/74; G06T 2207/20081; G06T 2207/30148; H04N 5/247; G01N 21/9501
See application file for complete search history.

(56) References Cited

U.S. PATENT DOCUMENTS

| | | | | |
|---|---|---|---|---|
| 6,466,314 | B1* | 10/2002 | Lehman | G03F 7/70433 356/394 |
| 2006/0164657 | A1* | 7/2006 | Chalmers | G01B 11/0641 356/630 |
| 2018/0240225 | A1* | 8/2018 | Harada | G06T 7/001 |
| 2018/0275525 | A1* | 9/2018 | Bow | G03F 7/70875 |
| 2019/0362221 | A1* | 11/2019 | Ando | G06V 10/7788 |
| 2019/0389031 | A1* | 12/2019 | Nakamura | B24B 49/02 |

FOREIGN PATENT DOCUMENTS

| | | |
|---|---|---|
| TW | 201505116 A | 2/2015 |
| TW | 201816670 A | 5/2018 |
| WO | 2018150210 A | 8/2018 |

* cited by examiner

SUBSTRATE STATE DETERMINING APPARATUS, SUBSTRATE PROCESSING APPARATUS, MODEL GENERATING APPARATUS, AND SUBSTRATE STATE DETERMINING METHOD

CROSS-REFERENCE TO RELATED APPLICATIONS

This application is based on and claims priority from Japanese Patent Application No. 2018-167226, filed on Sep. 6, 2018, with the Japan Patent Office, the disclosure of which is incorporated herein in its entirety by reference.

TECHNICAL FIELD

The present disclosure relates to a substrate state determining apparatus, a substrate processing apparatus, a model generating apparatus, and a substrate state determining method.

BACKGROUND

There is known a technique capable of detecting that a substrate becomes a rotatable state where the substrate is not ejected even though the rotary table is rotated when a substrate processing is performed using a rotary table (see, e.g., Japanese Patent Laid-Open Publication No. 2014-229861).

SUMMARY

According to an aspect of the present disclosure, a substrate state determining apparatus includes: an image capturing unit that captures an image of a substrate placed on a stage; a learning unit that executes a machine learning using training data in which information indicating a state of the substrate is attached to the image of the substrate, so as to generate a substrate state determination model in which the image of the substrate is taken as an input and a value related to the state of the substrate corresponding to the image of the substrate is taken as an output; and a determination unit that determines the state of the substrate corresponding to the image of the substrate captured by the image capturing unit, using the substrate state determination model generated by the learning unit.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

First Embodiment

Substrate Processing Apparatus

Figure 1:
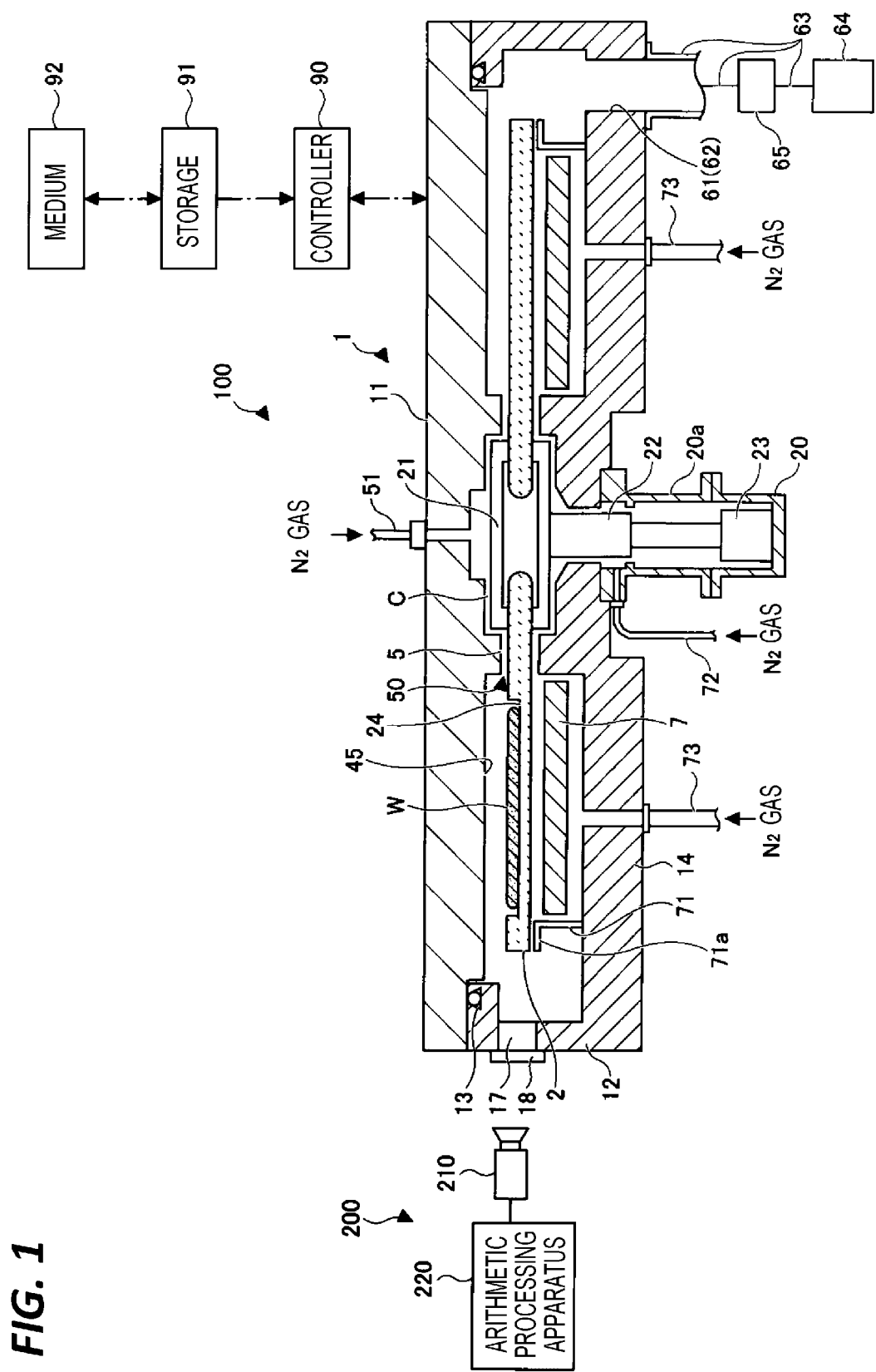
FIG. 1 is a view illustrating an example of a configuration of a substrate processing apparatus according to a first embodiment.
Figure 2:
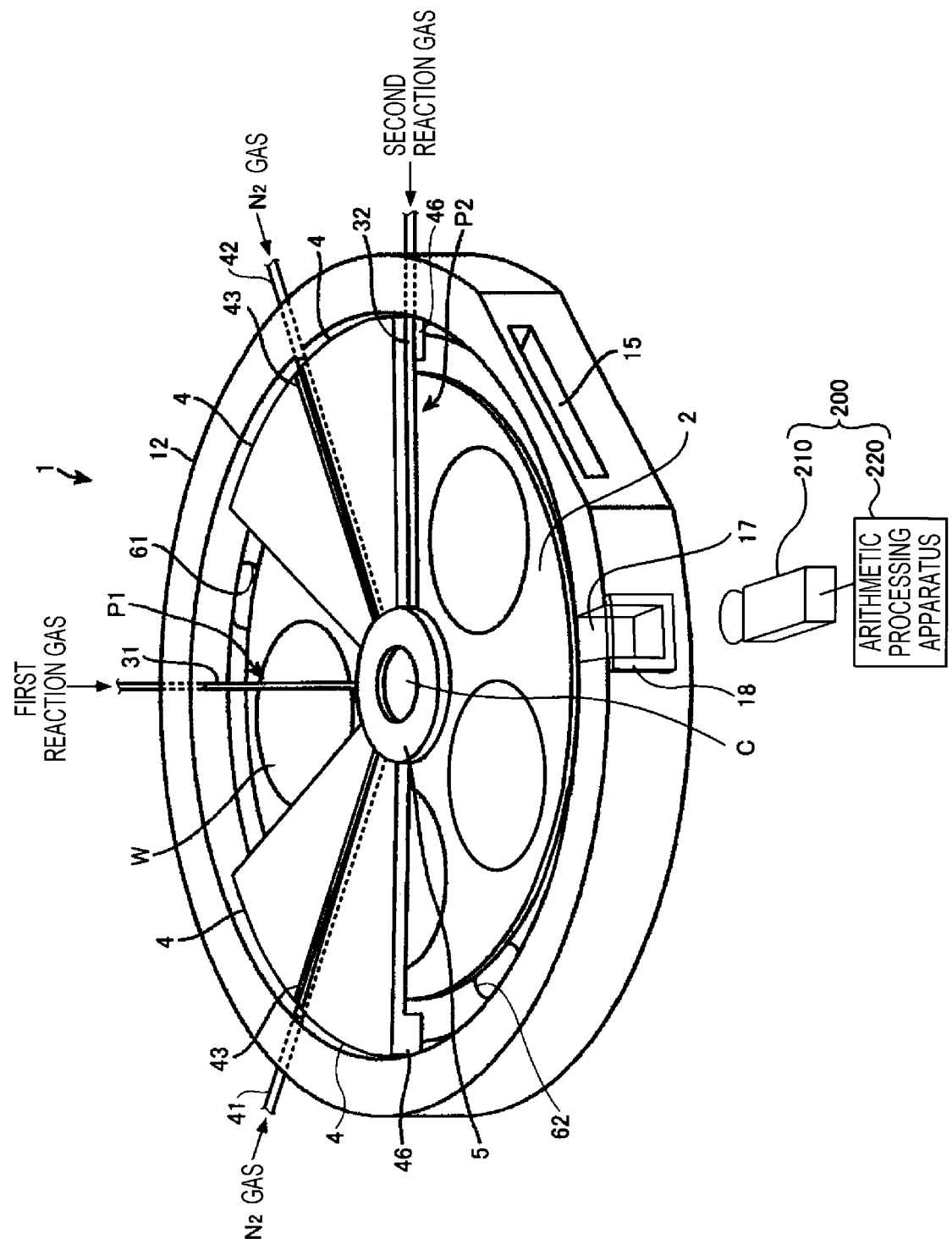
FIG. 2 is a perspective view of the substrate processing apparatus of FIG. 1.
Figure 3:
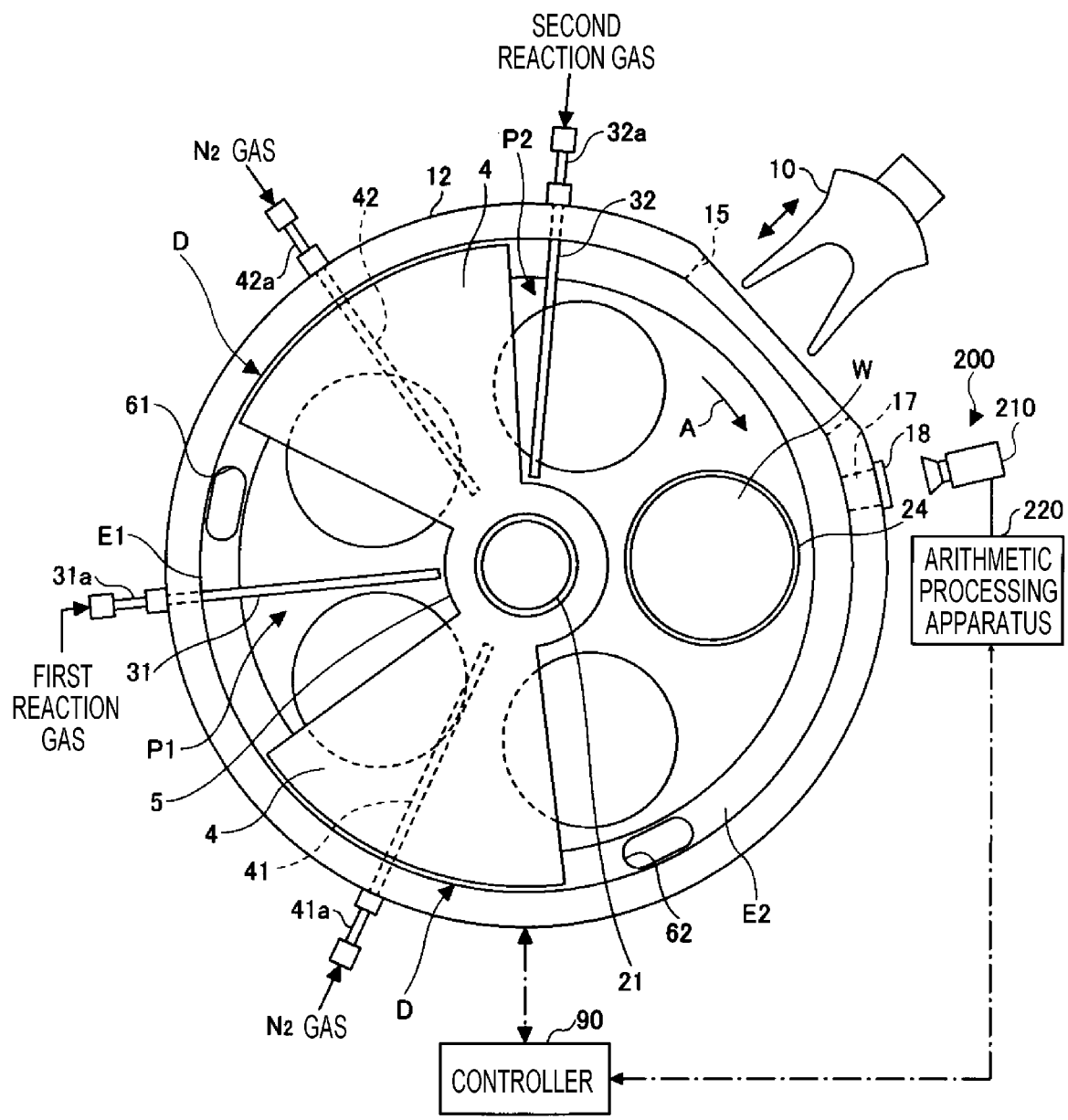
FIG. 3 is a plan view illustrating an internal configuration of a vacuum container of the substrate processing apparatus of FIG. 1.

Descriptions will be made on an example of a configuration of a substrate processing apparatus according to a first embodiment. FIG. 1 is a view illustrating an example of the configuration of the substrate processing apparatus according to the first embodiment. FIG. 2 is a perspective view of the substrate processing apparatus of FIG. 1. FIG. 3 is a plan view illustrating an internal configuration of a vacuum container of the substrate processing apparatus of FIG. 1.

As illustrated in FIG. 1, a substrate processing apparatus 100 according to the first embodiment includes, for example, a chamber 1, a rotary table 2, a window 18, a rotary shaft 22, recessed portions 24, a controller 90, and a substrate state determining apparatus 200, as main components. In addition, the substrate processing apparatus 100 may include various components in the chamber 1 which are necessary for a substrate processing and various components attached to the chamber 1, as necessary.

The chamber 1 is a processing container in which a processing is performed on a substrate such as a wafer W. The chamber 1 is a flat container having a substantially circular shape when viewed from above. The chamber 1 includes a top plate 11 and a container body 12. The top plate 11 is separable from the container body 12. The top plate 11 is pressed to the container body 12 via a sealing member 13 such as, for example, an O-ring due to a pressure reduced state inside the chamber 1, and as a result, the chamber 1 is airtightly sealed. Meanwhile, the top plate 11 is separated from the container body 12 by being lifted upward by a driving mechanism (not illustrated). The rotary table 2 is provided inside the chamber 1 and has a rotation center at the center of the chamber 1.

The rotary table 2 is a disk-shaped stage that places the wafer W thereon. A plurality of recessed portions 24 are formed on the surface of the rotary table 2 along the circumferential direction of the rotary table 2. Each recessed portion 24 has substantially the same size as the wafer W, and the wafer W is placed in the recessed portion 24. The depth of the recessed portion 24 may be the same as the thickness of the wafer W, or may be deeper than the thickness of the wafer W. The example of FIG. 1 represents a case where the thickness of the wafer W and the depth of the recessed portion 24 are substantially the same.

The rotary table 2 is fixed to a cylindrical core 21 at the center thereof. The core 21 is fixed to the upper end of the rotary shaft 22 that extends vertically. The rotary shaft 22 penetrates the bottom 14 of the container body 12, and the lower end of the rotary shaft 22 is attached to a driving unit 23. The driving unit 23 rotates the rotary shaft 22 around the vertical axis. The rotary shaft 22 and the driving unit 23 are accommodated in a top-opened cylindrical housing body 20. The housing body 20 is airtightly attached to the lower surface of the bottom 14 of the chamber 1 via a flange 20a provided on the upper surface of the housing body 20. Thus, the inside of the housing body 20 is isolated from the outside atmosphere.

Further, reaction gas nozzles 31 and 32 and separation gas nozzles 41 and 42 which are each made of quartz are arranged above the rotary table 2 in the circumferential direction of the chamber 1 (the rotation direction of the rotary table 2 (an arrow A in FIG. 3)) while being spaced apart from each other. In the illustrated example, the separation gas nozzle 41, the reaction gas nozzle 31, the separation gas nozzle 42, and the reaction gas nozzle 32 are arranged in this order in the clockwise direction (the rotation direction of the rotary table 2) from a conveyance port 15 to be described later. Gas introduction ports 31a, 32a, 41a, and 42a (FIG. 3) which are the base ends of the reaction gas nozzles 31 and 32 and the separation gas nozzles 41 and 42, respectively, are fixed to the outer peripheral surface of the container body 12. As a result, the nozzles are introduced into the chamber 1 from the outer peripheral surface of the chamber 1, and attached to extend horizontally with respect to the rotary table 2 along the radial direction of the container body 12.

The reaction gas nozzle 31 is connected to a supply source of a first reaction gas (not illustrated) via, for example, a pipe or a flow rate controller (not illustrated). The reaction gas nozzle 32 is connected to a supply source of a second reaction gas (not illustrated) via, for example, a pipe or a flow rate controller (not illustrated). The separation gas nozzles 41 and 42 are connected to supply sources of a separation gas (not illustrated) via, for example, pipes or flow rate controllers (not illustrated). A film formation gas such as Si-containing gas may be used as the first reaction gas, and a gas such as oxidizing gas or nitriding gas or the film formation gas similar to the first reaction gas may be used as the second reaction gas. As the separation gas, a rare gas such as helium (He) or argon (Ar) or an inert gas such as nitrogen ($N_2$) gas may be used.

In each of the reaction gas nozzles 31 and 32, ejection holes 33 (FIG. 4) are arranged at an interval of, for example, 10 mm along the length direction of the corresponding nozzle. The area under the reaction gas nozzle 31 becomes a first processing area P1 where the first reaction gas is adsorbed to the wafer W. The area under the reaction gas nozzle 32 becomes a second processing area P2 where the second reaction gas is supplied to react with the first reaction gas adsorbed to the wafer W in the first processing area P1, and a reaction product of the first reaction gas and the second reaction gas is deposited.

The wafer W is rotated and sequentially passes the first processing area P1 where the first reaction gas is supplied and the second processing area P2 where the second reaction gas is supplied, such that the first reaction gas is adsorbed onto the surface of the wafer W, and subsequently, the reaction product by the reaction between the first reaction gas and the second reaction gas is deposited. As a result, an atomic layer or a molecular layer of the reaction product is formed on the surface of the wafer W.

A hole 17 is formed in a portion of the side wall of the container body 12 such that an image of the inside of the chamber 1 may be captured with a camera 210 to be described later. The hole 17 is closed by a window 18. In other words, the camera 210 captures an image of the inside of the chamber 1 through the window 18. The hole 17 and the window 18 are installed at the height where an image of the surface of the rotary table 2 may be captured from the external camera 210. Meanwhile, the hole 17 may be formed by cutting out a portion of the side wall of the container body 12. In addition, the window 18 may be made of various materials that transmit light, and may be configured as, for example, a quartz window made of a quartz glass. The window 18 may be provided to cover the hole 17 from the outside of the container body 12, or may be provided to fit in a groove formed at any one position in the thickness direction of the hole 17. The window 18 may be installed in various aspects as long as the airtightness of the chamber 1 may be kept, and the inside of the chamber 1 may be observed from the outside.

Next, the substrate processing apparatus 100 will be described in more detail.

As illustrated in FIGS. 2 and 3, two projected portions 4 are formed in the chamber 1. The projected portions 4 constitute separation areas D together with the separation gas nozzles 41 and 42, and are attached to the back surface of the top plate 11 to be projected toward the rotary table 2 as described later. Each projected portion 4 has a fan shape cut in an arc shape at the top portion thereof when viewed from above, and is disposed such that the inner arc is connected to a protrusion 5, and the outer arc follows the inner peripheral surface of the container body 12 of the chamber 1.

Figure 4:
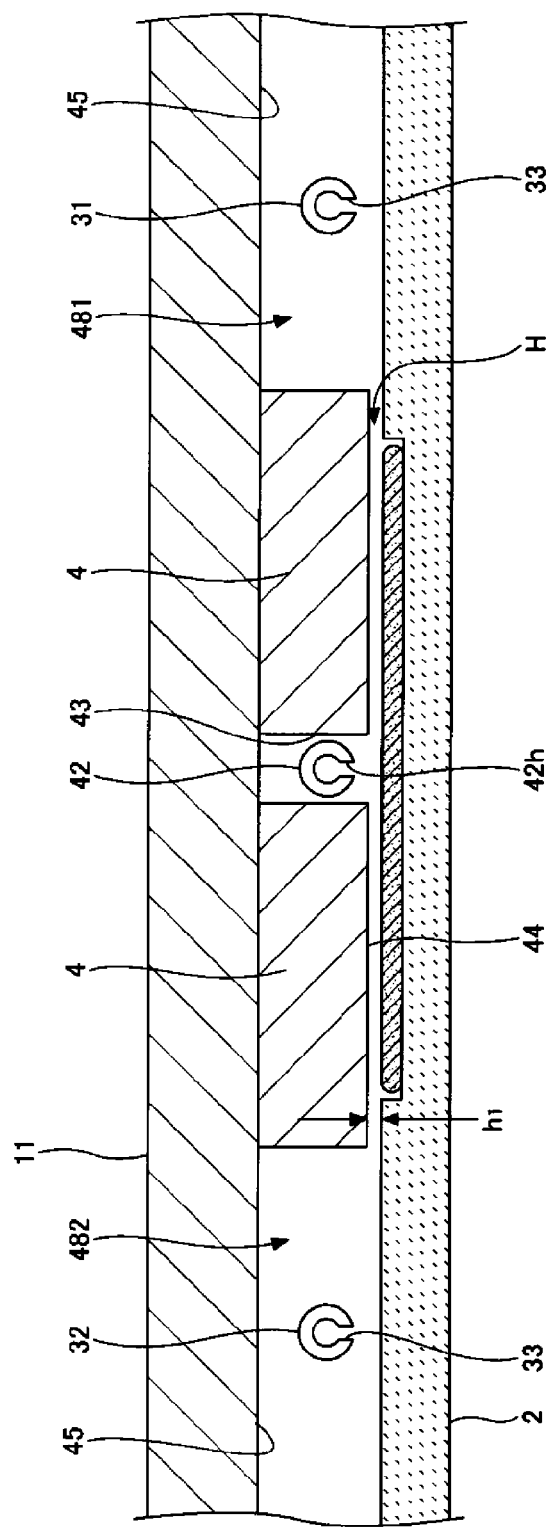
FIG. 4 is a cross-sectional view of a chamber which is taken along a concentric circle of a rotary table of the substrate processing apparatus of FIG. 1.

FIG. 4 is a cross-sectional view of the chamber 1 which is taken along the concentric circle of the rotary table 2 of the substrate processing apparatus 100 of FIG. 1, and illustrates the cross-section of the chamber 1 along the concentric circle of the rotary table 2 from the reaction gas nozzle 31 to the reaction gas nozzle 32 in the substrate processing apparatus 100. As illustrated in FIG. 4, each projected portion 4 is attached to the back surface of the top plate 11. Thus, in the chamber 1, there exist a first ceiling surface 44 that is flat and low and constitutes the lower surface of the projected portion 4, and a second ceiling surface 45 that is positioned on the circumferentially opposite sides of the first ceiling surface 44 and is higher than the first ceiling surface 44. The first ceiling surface 44 has a fan shape cut in an arc shape at the top portion thereof when viewed from above. Further, a groove 43 is formed in the projected portion 4 to extend radially from the circumferential center of the projected portion 4. The separation gas nozzle 42 is accommodated in the groove 43. The groove 43 is also formed in the other projected portion 4, and the separation gas nozzle 41 is accommodated in the groove 43. In each of the separation gas nozzles 41 and 42, a plurality of gas ejection holes 42h are arranged along the longitudinal direction of the separation gas nozzle 41 and 42 at an interval of, for example, 10 mm, to be opened toward the rotary table 2. In addition, the reaction gas nozzles 31 and 32 are provided in the spaces below the second ceiling surface 45, respectively. The reaction gas nozzles 31 and 32 are spaced apart from the second ceiling surface 45 and provided near the wafer W.

The first ceiling surface 44 forms a narrow separation space H with respect to the rotary table 2. When $N_2$ gas is supplied from the gas ejection holes 42h of the separation gas nozzle 42, the $N_2$ gas flows toward spaces 481 and 482 below the second ceiling surface 45 where the reaction gas nozzles 31 and 32 are provided, through the separation space H. At this time, the volume of the separation space H is smaller than the volumes of the spaces 481 and 482. Hence, the pressure of the separation space H may become higher than the pressures of the spaces 481 and 482 by the $N_2$ gas. That is, the separation space H having a relatively high pressure is formed between the spaces 481 and 482. In addition, the $N_2$ gas that flows out from the separation space H into the spaces 481 and 482 acts as a counter flow against the first reaction gas from the first processing area P1 and the second reaction gas from the second processing area P2. Thus, the first reaction gas from the first processing area P1 and the second reaction gas from the second processing area P2 are separated from each other by the separation space H. Accordingly, the first and second reaction gases are suppressed from being mixed and reacting with each other in the chamber 1.

Meanwhile, the height hl of the first ceiling surface 44 from the upper surface of the rotary table 2 may be set to a height suitable for making the pressure of the separation space H higher than the pressures of the spaces 481 and 482, in consideration of, for example, the pressure in the chamber 1 during a film forming process, the rotation speed of the rotary table 2, and the flow rate of the separation gas.

Meanwhile, the protrusion 5 (FIGS. 2 and 3) is formed on the lower surface of the top plate 11 to surround the outer periphery of the core 21 that fixes the rotary table 2. The protrusion 5 is continuous to the portion of the projected portion 4 which is near to the rotation center, and the lower surface of the protrusion 5 is formed at the same height as that of the first ceiling surface 44. FIG. 1 referred to above illustrates the area where the second ceiling surface 45 is provided.

Figure 5:
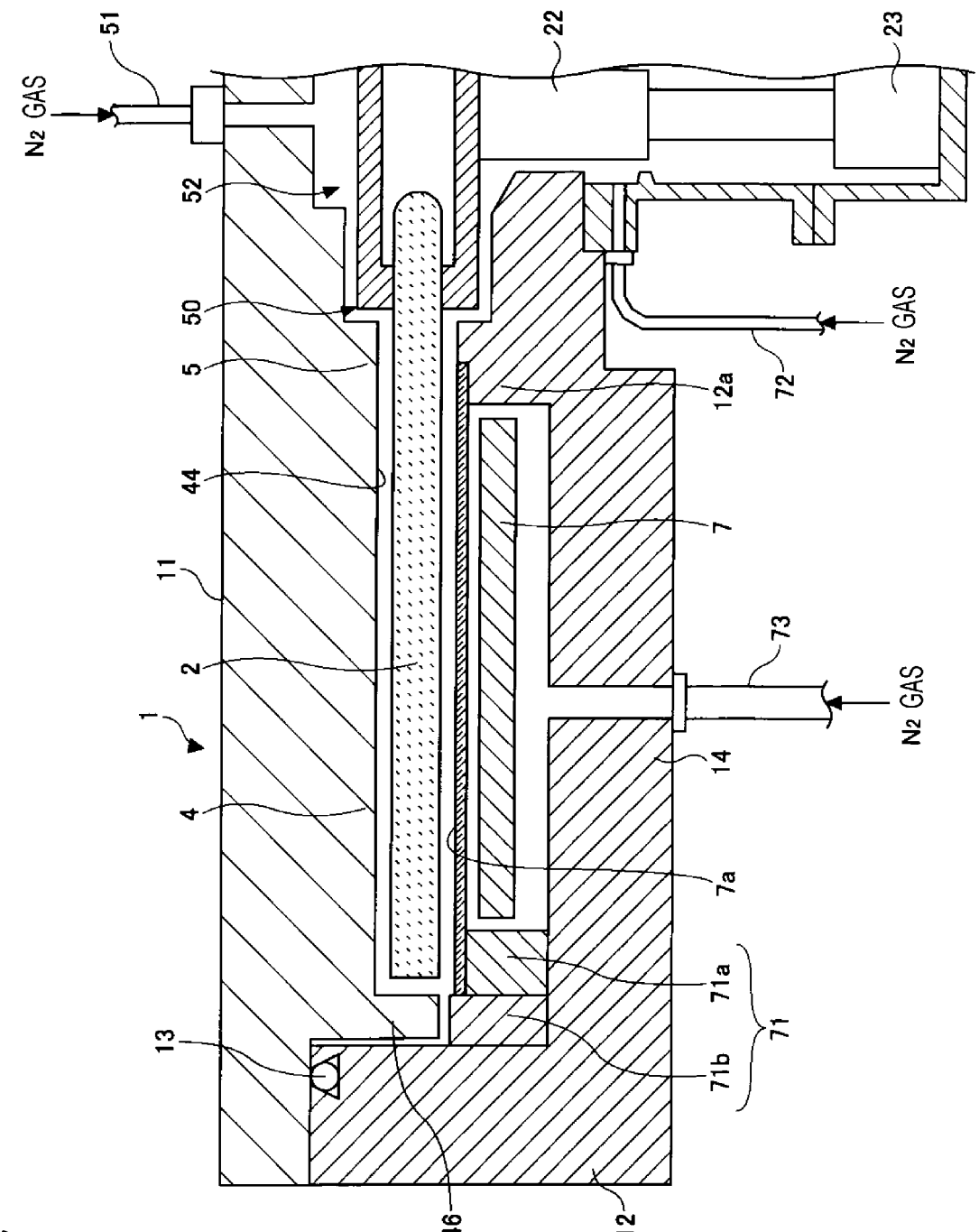
FIG. 5 is a cross-sectional view illustrating an area where a first ceiling surface is provided, in the substrate processing apparatus of FIG. 1.

Meanwhile, FIG. 5 is a cross-sectional view illustrating the area where the first ceiling surface 44 is provided, in the substrate processing apparatus 100 of FIG. 1. As illustrated in FIG. 5, a bent portion 46 is formed at the outer edge of the fan-shaped projected portion 4 to be bent in the L shape and face the outer end surface of the rotary table 2. Similarly to the projected portion 4, the bent portion 46 suppresses the reaction gases from being introduced from both sides of the separation area D, so that the first and second reaction gases are suppressed from being mixed with each other. Since the fan-shaped projected portion 4 is formed on the top plate 11, and the top plate 11 is configured to be detachable from the container body 12, a slight gap exists between the outer peripheral surface of the bent portion 46 and the container body 12. Each of the gap between the inner peripheral surface of the bent portion 46 and the outer end surface of the rotary table 2 and the gap between the outer peripheral surface of the bent portion 46 and the container body 12 is set to the same dimension as the height of the first ceiling surface 44 from the upper surface of the rotary table 2.

In the separation areas D, as illustrated in FIG. 5, the inner peripheral surface of the container body 12 is formed as the vertical surface close to the outer peripheral surface of the bent portion 46. Meanwhile, in the portions other than the separation areas D, as illustrated in FIG. 1, the inner peripheral surface of the container body 12 is recessed outwardly from the portion of the container body 12 facing the outer end surface of the rotary table 2 to the bottom 14, so as to form exhaust areas. Specifically, the exhaust area that communicates with the first processing area P1 will be referred to as a first exhaust area E1, and the exhaust area that communicates with the second processing area P2 will be referred to as a second exhaust area E2. As illustrated in FIGS. 1 to 3, a first exhaust port 61 and a second exhaust port 62 are formed at the bottoms of the first exhaust area E1 and the second exhaust area E2, respectively. As illustrated in FIG. 1, each of the first exhaust port 61 and the second exhaust port 62 is connected to an exhaust device 64 such as, for example, a vacuum pump via an exhaust pipe 63. A pressure controller 65 is provided in the exhaust pipe 63.

As illustrated in FIGS. 1 and 5, a heater unit 7 is provided in the space between the rotary table 2 and the bottom 14 of the chamber 1, and the wafer W on the rotary table 2 is heated to a temperature determined by a process recipe (e.g., 400° C.) via the rotary table 2. A ring-shaped cover member 71 is provided below the vicinity of the peripheral edge of the rotary table 2. The cover member 71 partitions the atmosphere ranging from the space above the rotary table 2 to the first exhaust area E1 and the second exhaust area E2, from the atmosphere where the heater unit 7 is placed, and suppresses the introduction of a gas into the area below the rotary table 2. The cover member 71 includes an inner member 71a provided to face, from the lower side, the outer edge of the rotary table 2 and the outer periphery from the outer edge of the rotary table 2, and an outer member 71b provided between the inner member 71a and the inner peripheral surface of the container 1. The inner member 71a surrounds the entire circumference of the heater unit 7 below the outer edge of the rotary table 2 (and below the slightly outer portion from the outer edge). In the separation areas D, the outer member 71b is provided below and close to the bent portion 46 formed at the outer edge of the projected portion 4.

The portion of the bottom 14 which is close to the rotation center from the space where the heater unit 7 is disposed protrudes upward and approaches the core 21 in the vicinity of the center of the lower surface of the rotary table 2, so as to form a protrusion 12a. The space between the protrusion 12a and the core 21 is narrow, the gap between the inner peripheral surface of the through hole of the bottom 14 through which the rotary shaft 22 penetrates and the rotary shaft 22 is also narrow, and these narrow spaces communicate with the housing body 20. In addition, in the housing body 20, a purge gas supply pipe 72 is provided to supply $N_2$ gas as a purge gas into the narrow spaces and purge the spaces. Further, a plurality of purge gas supply pipes 73 are provided in the bottom 14 of the chamber 1 below the heater unit 7 at a predetermined circumferential angular interval, to purge the space where the heat unit 7 is disposed. In addition, a cover member 7a is provided between the heater unit 7 and the rotary table 2 to circumferentially cover the space between the inner peripheral surface of the outer member 71b (the upper surface of the inner member 71a) and the upper end of the protrusion 12a, in order to suppress the introduction of a gas into the area where the heater unit 7 is provided. The cover member 7a may be made of, for example, quartz.

In addition, a separation gas supply pipe 51 is connected to the center of the top plate 11 of the chamber 1, and configured to supply $N_2$ gas as the separation gas into a space 52 between the top plate 11 and the core 21. The separation gas supplied into the space 52 is ejected toward the peripheral edge of the rotary table 2 along the surface of the rotary table 2 in the wafer placement area, through a narrow gap 50 between the protrusion 5 and the rotary table 2. The gap 50 may be kept at the higher pressure than that in the spaces 481 and 482 by the separation gas. Thus, by the gap 50, the first reaction gas supplied to the first processing area P1 and the second reaction gas supplied to the second processing area P2 are suppressed from being mixed with each other through a central area C. That is, the gap 50 (or the central area C) has the same function as the separation space H (or the separation areas D).

In addition, as illustrated in FIGS. 2 and 3, the conveyance port 15 is formed in the side wall of the chamber 1 to convey the wafer W as a substrate between an external conveyance arm 10 and the rotary table 2. The conveyance port 15 is opened/closed by a gate valve (not illustrated). In addition, in the recessed portion 24 which is the wafer placement area on the rotary table 2, the wafer W is conveyed to or from the conveyance arm 10 at the position facing the conveyance arm 10. Hence, conveyance lift pins and a lift mechanism thereof (these components are not illustrated) are provided at the portion corresponding to the conveyance position below the rotary table 2, to penetrate the recessed portion 24 and lift the wafer W from the back surface of the rotary table 2.

The controller 90 controls the operation of each unit of the substrate processing apparatus 100. The controller 90 may be, for example, a computer. A computer program for controlling the operation of each unit of the substrate processing apparatus 100 is stored in a medium 92, read into a storage 91 by a predetermined reading device, and installed in the controller 90. The medium 92 may be, for example, a hard disk, a compact disk, a magneto-optical disk, a memory card or a flexible disk.

Substrate State Determining Apparatus

Figure 6:
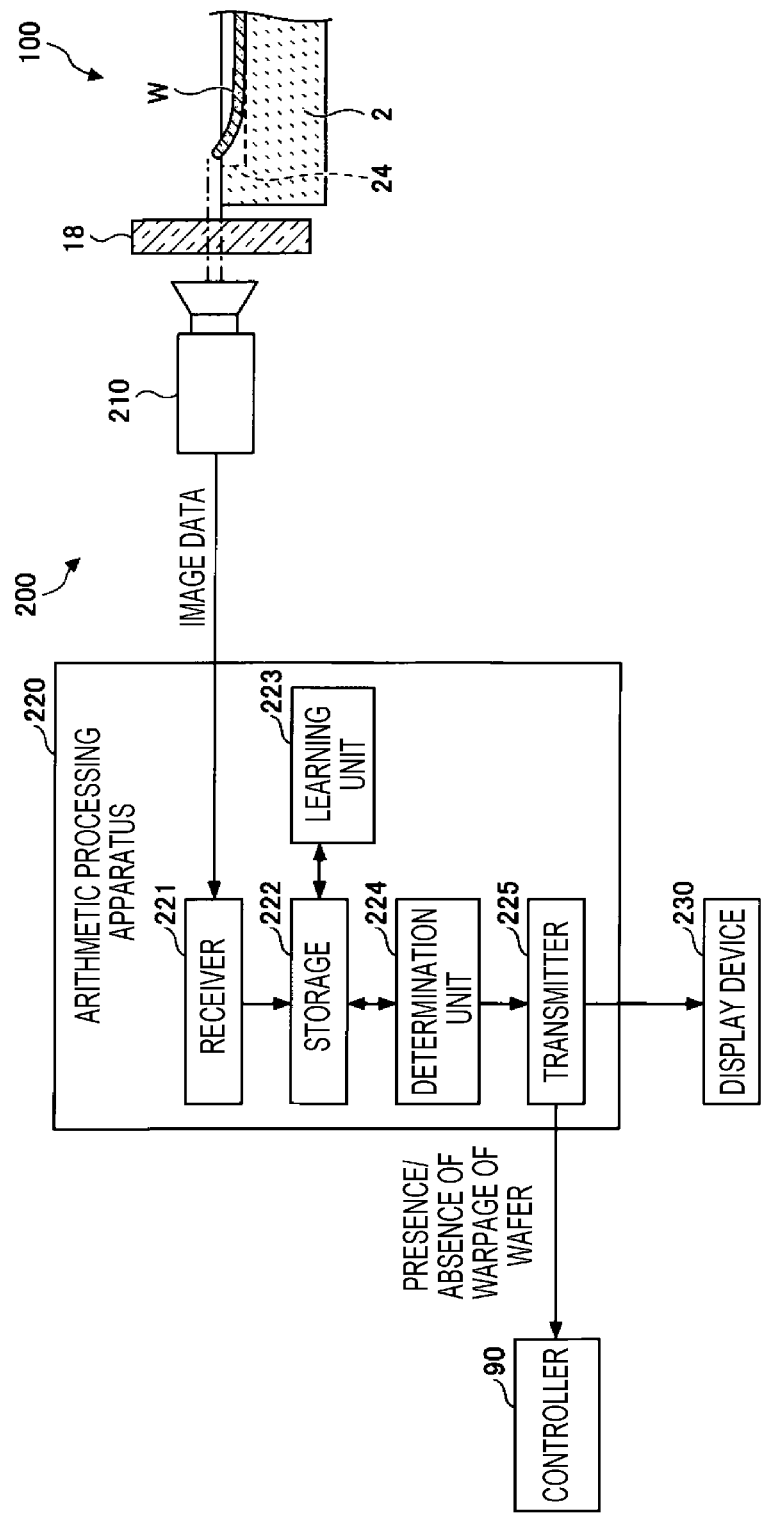
FIG. 6 is a view illustrating an example of a configuration of a substrate state determining apparatus.
Figure 7:
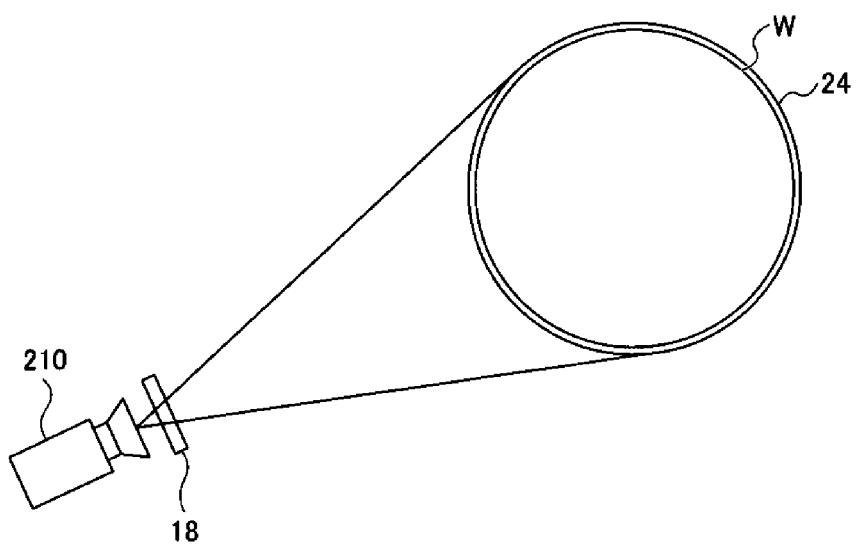
FIG. 7 is a view illustrating an example of an image capturing range of a camera.

A substrate state determining apparatus 200 will be described. FIG. 6 is a view illustrating an example of a configuration of the substrate state determining apparatus 200. FIG. 7 is a view illustrating an example of an image capturing range of the camera 210.

As illustrated in FIG. 6, the substrate state determining apparatus 200 includes the camera 210, an arithmetic processing apparatus 220, and a display device 230.

The camera 210 is an image capturing unit that captures an image of the wafer W placed on the recessed portion 24 formed on the surface of the rotary table 2, from the lateral side through the window 18. The window 18 is disposed to include at least the area with the same height as that of the surface of the rotary table 2, such that the camera 210 is able to capture an image of the surface of the rotary table 2 at substantially the same height as that of the surface of the rotary table 2. The camera 210 is able to capture an image including the surface of the rotary table 2 or the edge of the end of the recessed portion 24, and the area of the wafer W that protrudes out of the recessed portion 24, and is able to detect that the upper end of the wafer W protrudes out of the recessed portion 24 in the height direction, through the image capturing. The image data captured by the camera 210 is transmitted to the arithmetic processing apparatus 220.

For example, as illustrated in FIG. 7, the image capturing range of the camera 210 is set such that an image of the entire circumferential end of the wafer W may be captured at one time. As a result, an image including the opposite ends of the wafer W may be obtained by one image capturing with the camera 210, so that the state of the entire wafer W may be grasped. Thus, it is possible to reliably ensure the state where the wafer W is not ejected from any portion in the rotary table 2 even when the rotary table 2 is rotated. The image capturing range of the camera 210 may be adjusted, for example, by changing the viewing angle of the camera 210, the size of the window 18, and the distance between the window 18 and the camera 210. The camera 210 only needs to be capable of capturing an image of the inside of the chamber 1, and may be, for example, a charged-coupled device (CCD) camera or a complementary metal-oxide-semiconductor (CMOS) camera.

The arithmetic processing apparatus 220 functions as a model generating apparatus that executes a machine learning using training data in which information indicating the state of the wafer W is attached to the image of the wafer W placed on the rotary table 2, so as to generate a substrate state determination model. The substrate state determination model is a model in which the image of the wafer W is taken as an input, and a value related to the state of the wafer W corresponding to the image of the wafer W is taken as an output. Further, the arithmetic processing apparatus 220 determines the state of the wafer W corresponding to the image of the wafer W captured by the camera 210 by using the substrate state determination model, and determines whether the rotary table 2 is in a state where the rotation of the rotary table 2 may be started. The arithmetic processing apparatus 220 is a computer configured to be capable of performing an arithmetic processing, and includes, for example, a CPU (central processing unit) or a GPU (graphics processing unit). The arithmetic processing apparatus 220 includes a receiver 221, a storage 222, a learning unit 223, a determination unit 224, and a transmitter 225.

The receiver 221 receives the image data captured by the camera 210.

The storage 222 stores, for example, the image data received by the receiver 221 and the training data to be described later.

The learning unit 223 executes the machine learning using the training data in which the information indicating the state of the wafer W is attached to the image of the wafer W, so as to generate the substrate state determination model in which the image of the wafer W is taken as an input, and a value related to the state of the wafer W corresponding to the image of the wafer W is taken as an output. As for the machine learning, for example, a deep learning may be used. The training data is generated by acquiring images of the wafer W under various conditions, classifying the acquired images of the wafer W according to states of the wafer W, and storing the states of the wafer W in association with the images of the wafer W. The work for classifying the images of the wafer W according to the states of the wafer W may be performed by, for example, a user or may be performed using classification support software that supports the classification. In addition, the training data may be generated using data augmentation such as, for example, increasing the number of data pieces. As a result, since the number of images to be acquired to generate the training data may be reduced, the burden of work on the user may be reduced, and the time required for the classification work may be reduced.

The training data includes, for example, a plurality of images different in brightness of the surface of the rotary table 2, a plurality of images different in film thicknesses of a film deposited on the rotary table 2, and a plurality of images different in temperature of the rotary table 2. As a result, it is possible to suppress an erroneous determination caused from a variance of an image capturing environment. The variance of the image capturing environment includes, for example, a variance of brightness inside the chamber 1 due to different process temperatures. Further, the variance of the image capturing environment includes, for example, a variance of brightness of the surface of the rotary table 2 due to a deposition of a film on the rotary table 2 by the film forming process, and a variance of brightness of the surface of the rotary table 2 due to a deterioration of the surface of the rotary table 2 by a cleaning process.

The state of the wafer W includes, for example, a state where the wafer W is warped and a state where the wafer W is not warped. In addition, the state of the wafer W may include, for example, a state where the wafer W is not placed in the recessed portion 24 of the rotary table 2 and a state where the wafer W deviates from the placement position in the recessed portion 24 of the rotary table 2.

FIGS. 8A to 8D are views illustrating an example of the training data. FIGS. 8A to 8D illustrate pieces of training data in which wafers W are in different warped states.

Figure 8A:
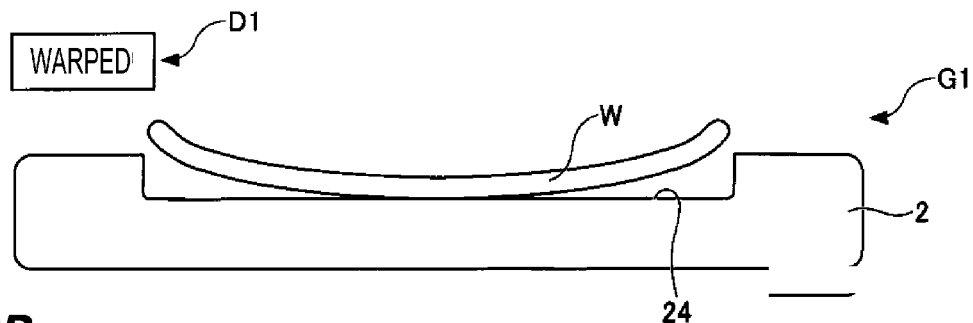
FIGS. 8A to 8D are views illustrating an example of training data.

The training data illustrated in FIG. 8A is data in which information D1 indicating the state of the wafer W is attached to an image G1 of the wafer W. The image G1 of the wafer W is an image of a state where the wafer W is placed in the recessed portion 24 formed on the surface of the rotary table 2, and the entire end of the wafer W is warped upward and is present above the surface of the rotary table 2. The information D1 indicating the state of the wafer W is "Warped."

Figure 8B:
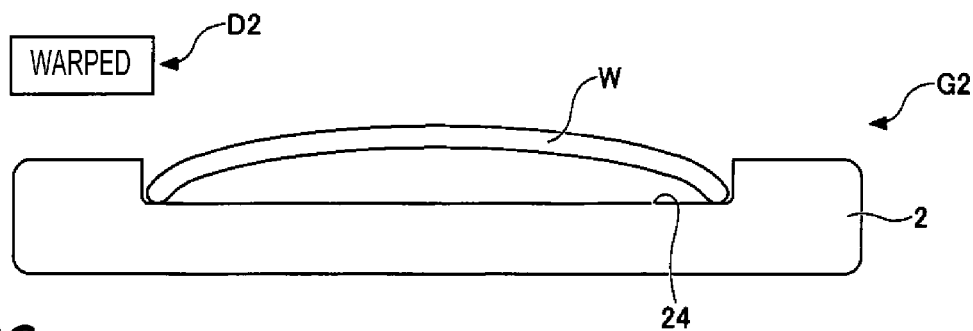

The training data illustrated in FIG. 8B is data in which information D2 indicating the state of the wafer W is attached to an image G2 of the wafer W. The image G2 of the wafer W is an image of a state where the wafer W is placed in the recessed portion 24 formed on the surface of the rotary table 2, and the center of the wafer W is warped upward and is present above the surface of the rotary table 2. The information D2 indicating the state of the wafer W is "Warped."

Figure 8C:
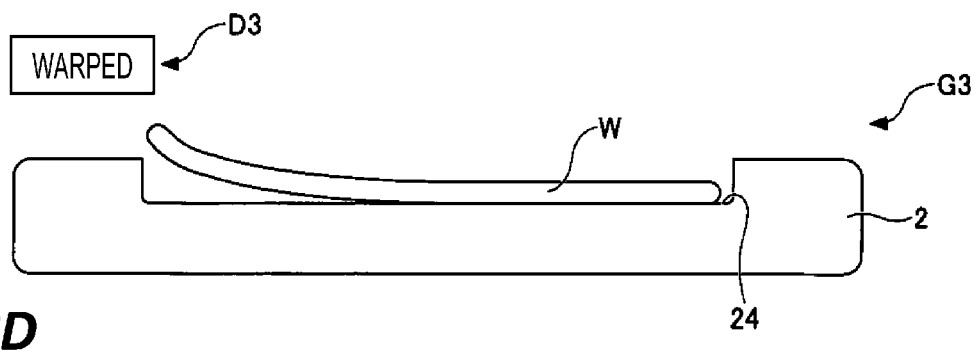

The training data illustrated in FIG. 8C is data in which information D3 indicating the state of the wafer W is attached to an image G3 of the wafer W. The image G3 of the wafer W is an image of a state where the wafer W is placed in the recessed portion 24 formed on the surface of the rotary table 2, and a portion of the end of the wafer W is warped upward and is present above the surface of the rotary table 2. The information D3 indicating the state of the wafer W is "Warped."

Figure 8D:
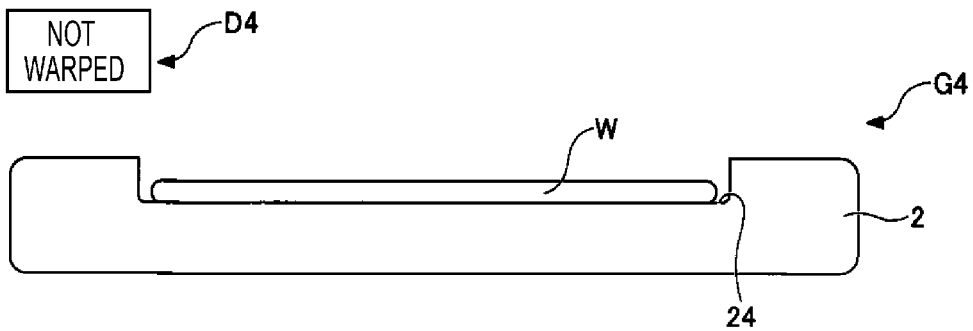

The training data illustrated in FIG. 8D is data in which information D4 indicating the state of the wafer W is attached to an image G4 of the wafer W. The image G4 of the wafer W is an image of a state where the wafer W is not warped and the entire wafer W is present below the surface of the rotary table 2. The information D4 indicating the state of the wafer W is "Not Warped."

The determination unit 224 determines the state of the wafer W corresponding to the image of the wafer W captured by the camera 210, by using the substrate state determination model generated by the learning unit 223. In addition, the determination unit 224 stores the image of the wafer W captured by the camera 210 in association with the determined state of the wafer W corresponding to the image of the wafer W, in the storage 222. In addition, the substrate state determination model may be updated using the image of the wafer W stored in the storage 222 in association with the state of the wafer W as training data. Further, based on the determined state of the wafer W, the determination unit 224 determines whether the rotary table 2 is in a state where the rotation of the rotary table 2 may be started. For example, when the determined state of the wafer W is "Not Warped," the determination unit 224 determines that the rotary table 2 is in the state where the rotation of the rotary table 2 may be started. Meanwhile, when the determined state of the wafer W is "Warped," the determination unit 224 determines that the rotary table 2 is not in the state where the rotation of the rotary table 2 may be started. Further, the determination unit 224 outputs the determination result as to whether the rotary table 2 is in the state where the rotation of the rotary table 2 may be started, to the transmitter 225.

The transmitter 225 transmits the determination result output by the determination unit 224 to the controller 90. Based on the determination result received from the transmitter 225, the controller 90 controls whether to start the rotation of the rotary table 2 or cause the rotary table 2 to stand by without rotating the rotary table 2. For example, when the determination result that the rotary table 2 is in the state where the rotation of the rotary table 2 may be started is received from the transmitter 225, the controller 90 starts the rotation of the rotary table 2. Meanwhile, when the determination result that the rotary table 2 is not in the state where the rotation of the rotary table 2 may be started is received from the transmitter 225, the controller 90 does not rotate the rotary table 2 and causes the rotary table 2 to stand by.

The display device 230 displays the image of the wafer W captured by the camera 210 in association with the state of the wafer W that corresponds to the image of the wafer W and has been determined by the determination unit 224. Since the display device 230 displays the image of the wafer W and the state of the wafer W corresponding to the image of the wafer W in association with each other, the user may easily determine whether the determination by the substrate state determination device 200 is appropriate, by confirming the display device 230. The display device 230 may be, for example, a liquid crystal display or an organic EL (electroluminescence) display.

Substrate State Determining Process

Figure 9:
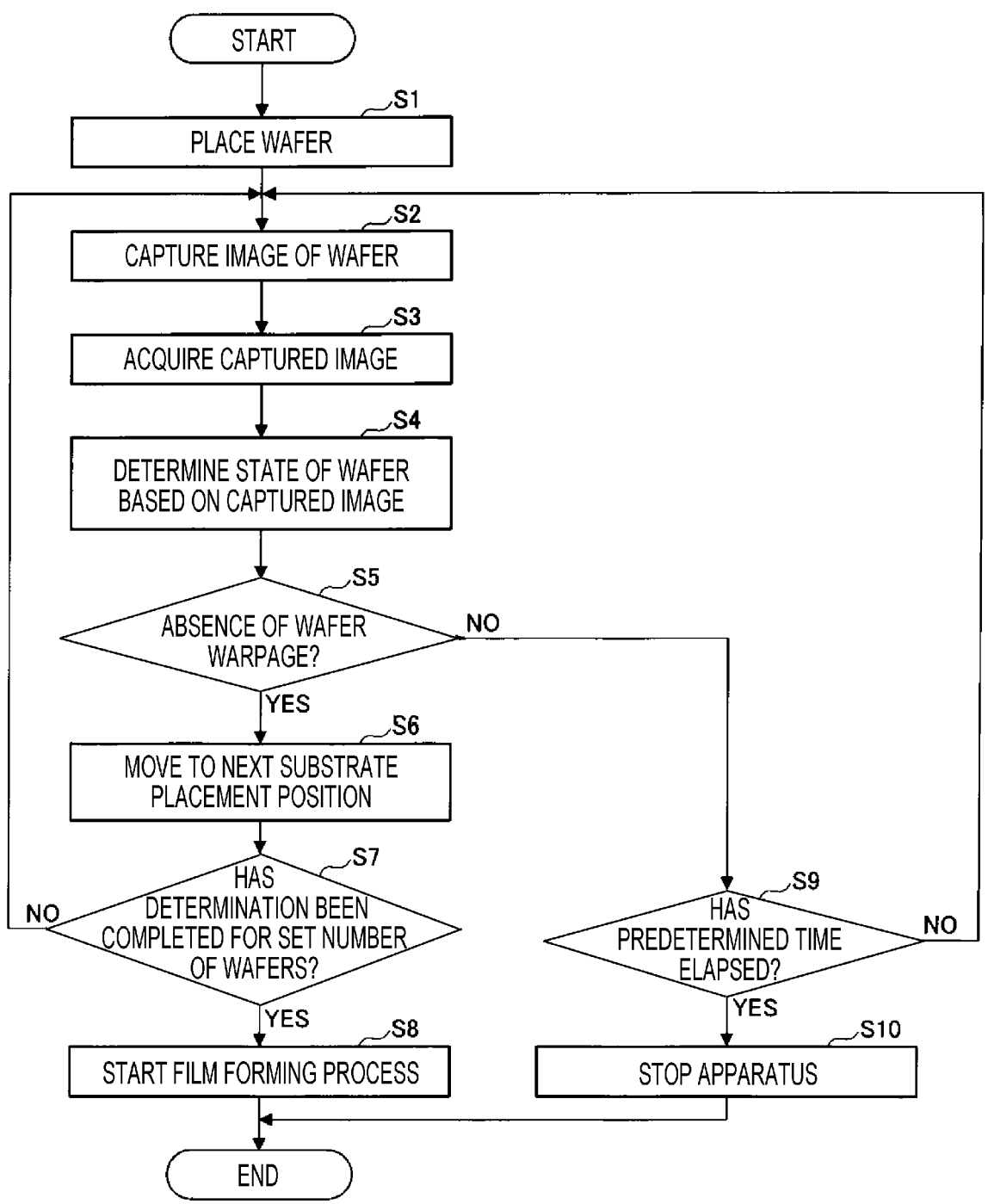
FIG. 9 is a flowchart illustrating an example of a substrate state determining process according to the first embodiment.

As for a substrate state determining process (a substrate state determining method) according to the first embodiment, descriptions will be made on, for example, a case where the substrate state determination device 200 determines the state of the wafer W placed in the recessed portion 24 formed on the surface of the rotary table 2. FIG. 9 is a flowchart illustrating an example of the substrate state determining process according to the first embodiment.

In step S1, the wafer W is placed on the recessed portion 24 which is the substrate placement area on the rotary table 2. At this time, since the wafer W moves from a room temperature environment to a high temperature environment of, for example, about 400° C., the wafer W is largely warped upward due to the rapid temperature variance.

In step S2, the camera 210 captures an image of the wafer W (an image capturing step). At this time, the image capturing is preferably performed such that an image of the entire lateral surface of the wafer W is captured. Accordingly, even in a case where a portion of the wafer W is warped, the warpage of the wafer W may be accurately detected.

In step S3, the image of the wafer W captured by the camera 210 in step S2 is transmitted to the arithmetic processing apparatus 220. Thus, the arithmetic processing apparatus 220 acquires the image of the wafer W.

In step S4, the arithmetic processing apparatus 220 determines the state of the wafer W corresponding to the image of the wafer W captured by the camera 210, by using the substrate state determination model (a determining step). The substrate state determination model is generated by executing the machine learning using training data in which the information indicating the state of the wafer W is added to the image of the wafer W. The substrate state determination model is a model in which the image of the wafer W is taken as an input, and a value related to the state of the wafer W corresponding to the image of the wafer W is taken as an output. The substrate state determination model is generated by the learning unit 223 of the arithmetic processing apparatus 220 before the substrate state determining process is performed (a learning step). As for the machine learning, for example, a deep learning may be used. The training data includes at least one of a plurality of images different in brightness of the surface of the rotary table 2, a plurality of images different in film thickness of a film deposited on the rotary table 2, and a plurality of images different in temperature of the rotary table 2. The state of the wafer W includes, for example, a state in which the wafer W is warped and a state in which the wafer W is not warped.

In step S5, the arithmetic processing apparatus 220 determines whether the rotary table 2 is in the state where the rotation of the rotary table 2 may be started, based on the state of the wafer W determined in step S4. Specifically, when the state of the wafer W determined in step S4 is "Not Warped," the arithmetic processing apparatus 220 determines that the rotary table 2 is in the state where the rotation of the rotary table 2 may be started. Meanwhile, when the state of the wafer W determined in step S4 is "Warped," the arithmetic processing apparatus 220 determines that the rotary table 2 is not in the state where the rotation of the rotary table 2 may be started. When it is determined in step S5 that the rotary table 2 is in the state where the rotation of the rotary table 2 may be started, the process proceeds to step S6.

In step S6, the rotary table 2 is slightly rotated such that the recessed portion 24 on which the next wafer W is placed moves to the position where the camera 210 is able to capture an image of the wafer W from the window 18.

In step S7, it is determined whether the determination of the rotatable state has been completed for a set number of wafers W in the step for moving the wafer W. For example, when the rotary table 2 has five recessed portions 24 along the rotation direction, it is determined whether the determination of the state of the wafer W has been completed for five wafers W.

When it is determined in step S7 that the determination of the rotatable state has been completed for the set number of wafers, the process proceeds to step S8. Meanwhile, when it is determined in step S7 that the determination of the rotatable state has not been completed for the set number of wafers, the process returns to step S2, and the process of determining the state of the wafer W is repeated. A series of processes are repeated for each wafer W, and when the determination is completed for the set number of wafers, the process proceeds to step S8.

In step S8, the film forming process is started in the substrate processing apparatus 100. Specifically, as described above in FIGS. 1 to 5, the rotation of the rotary table 2 is started, and the film forming process is performed. When a predetermined film forming process is completed, the process is ended.

Meanwhile, when it is determined in step S5 that the rotary table 2 is not in the state where the rotation of the rotary table 2 may be started, the process proceeds to step S9.

In step S9, it is determined whether a predetermined time has elapsed since the wafer W was placed on the recessed portion 24. The predetermined time is determined according to, for example, conditions of the film forming process.

When it is determined in step S9 that the predetermined time has not elapsed, the process returns to step S2, and the processes of steps S2 to S5 and S9 are repeated until the warpage of the wafer W is settled. Meanwhile, when it is determined in step S9 that the predetermined time has elapsed, the process proceeds to step S10.

In step S10, the arithmetic processing apparatus 220 outputs an alarm signal to the controller 90, and the controller 90 stops the operation of the substrate processing apparatus 100. Thus, the user of the substrate processing apparatus 100 may recognize an abnormality and check the state of the apparatus. In addition, the arithmetic processing apparatus 220 may output an alarm signal to the display device 230, and the display device 230 may display the alarm.

As described above, according to the first embodiment, the determination unit 224 determines the state of the wafer W corresponding to the image of the wafer W captured by the camera 210, using the substrate state determination model generated by the machine learning executed by the learning unit 223 using the training data. As a result, the state of the wafer W placed on the rotary table 2 may be detected with a high accuracy. Thus, the adjustment of the camera 210 becomes unnecessary. Further, since the possibility of a deviation of the wafer W due to an abnormality when the wafer W is placed on the rotary table 2 may be determined in real time, an apparatus trouble caused from the deviation of the wafer W may be suppressed in advance, and the apparatus may be stably operated. As a result, a yield or productivity is improved.

Meanwhile, in the embodiment described above, descriptions have been made on a case where after wafers W are placed on all of the plurality of recessed portions 24 formed on the rotary table 2, the substrate state determining process is performed on each wafer W. However, the substrate state determining process may be performed each time a wafer W is placed on each recessed portion 24.

In addition, in the embodiment described above, descriptions have been made on a case where when the rotary table 2 is rotated such that the recessed portion 24 on which the wafer W is placed moves to the position where the camera 210 is able to capture an image of the wafer W from the window 18, the rotation of the rotary table 2 is stopped, and the camera 210 captures an image of the wafer W. However, the present disclosure is not limited thereto. For example, when the rotary table 2 is rotated such that the recessed portion 24 on which the wafer W is placed moves to the position where the camera 210 is able to capture an image of the wafer W from the window 18, the camera 210 may capture an image of the wafer W in a state of maintaining the rotation of the rotary table 2.

Second Embodiment

Figure 10:
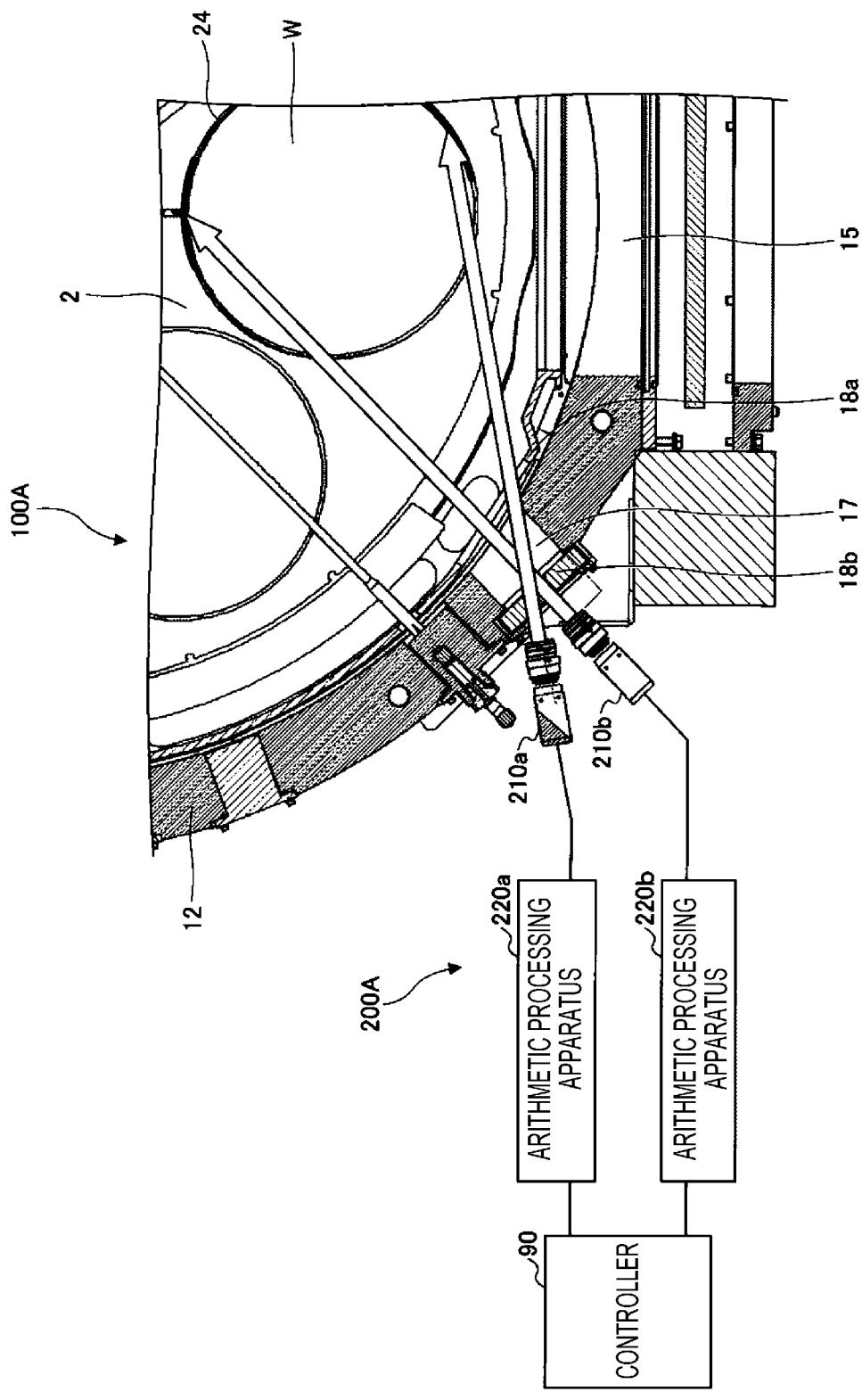
FIG. 10 is a view illustrating an example of a configuration of a substrate processing apparatus according to a second embodiment.

Descriptions will be made on an example of a configuration of a substrate processing apparatus according to a second embodiment. FIG. 10 is a view illustrating an example of the configuration of the substrate processing apparatus according to the second embodiment. FIG. 10 illustrates a view of the container body 12 of the chamber 1 from which the top plate 11 is removed, when viewed from above, and illustrates a state where the wafer W is placed on the recessed portion 24 formed on the surface of the rotary table 2. Further, the hole 17 is formed on the side wall of the container body 12, an inner window 18a is provided to cover the hole 17 at the side of the inner wall, and an outer window 18b is provided to cover the hole 17 at the side of the outer wall.

A substrate state determining apparatus 200A is provided outside the substrate processing apparatus 100A. The substrate state determining apparatus 200A includes two cameras 210a and 210b, arithmetic processing apparatuses 220a and 220b that correspond to the cameras 210a and 210b, respectively, and a controller 90. The camera 210a is an image capturing unit that captures an image of the recessed portion 24 and the wafer W near to the conveyance port 15, and the camera 210b is an image capturing unit that captures an image of the recessed portion 24 and the wafer W near to the rotary shaft 22 (near to the center of the rotary table 2).

In the substrate processing apparatus 100A, since images of the wafer W and the two opposite sides of the recessed portion 24 are captured, the hole 17 and the windows 18a and 18b are formed to have a sufficient size such that the images of the wafer W and the recessed portion 24 may be captured at a wide angle.

Each of the arithmetic processing apparatuses 220a and 220b functions as a model generating apparatus that generates a substrate state determination model by executing a machine learning using training data in which information indicating the state of each wafer W is attached to the image of the wafer W placed on the rotary table 2. The substrate state determination model is a model in which the image of the wafer W is taken as an input, and a value related to the state of the wafer W corresponding to the image of the wafer W is taken as an output. In addition, each of the arithmetic processing apparatuses 220a and 220b determines the state of the wafer W corresponding to the images of the wafer W captured by the cameras 210a and 210b using the substrate state determination model, and determines whether the rotary table 2 is in the state where the rotation of the rotary table 2 may be started. The arithmetic processing apparatuses 220a and 220b may be computers configured to be capable of executing an arithmetic processing, similarly to the arithmetic processing apparatus 220 according to the first embodiment. The arithmetic processing apparatuses 220a and 220b are connected to the cameras 210a and 210b, respectively, and have the same function as that of the arithmetic processing apparatus 220 described above in the first embodiment. Further, the controller 90 is connected to the arithmetic processing apparatuses 220a and 220b, as in the first embodiment.

Next, an example of the training data will be described. FIGS. 11A to 14B are views illustrating an example of the training data, and illustrate pieces of training data in which the states of wafers W are different. Further, in FIGS. 11A to 14B, FIGS. 11A, 12A, 13A, and 14A illustrate training data used when the arithmetic processing apparatus 220a generates the substrate state determination model, and FIGS. 11B, 12B, 13B, and 14B illustrate training data used when the arithmetic processing apparatus 220b generates the substrate state determination model.

Figure 11A:
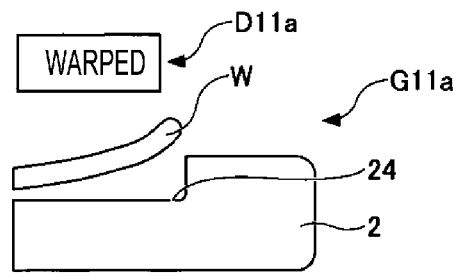
FIGS. 11A and 11B are views illustrating an example of training data.

The training data illustrated in FIG. 11A is data in which information D11a indicating the state of the wafer W is attached to an image G11a of the wafer W captured by the camera 210a. The image G11a of the wafer W is an image of a state where the wafer W is placed in the recessed portion 24 formed on the surface of the rotary table 2, and the end of the wafer W near to the conveyance port 15 is warped upward and is positioned above the surface of the rotary table 2. The information D11a indicating the state of the wafer W is "Warped."

Figure 11B:
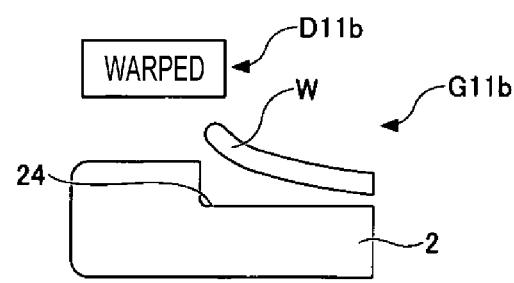

The training data illustrated in FIG. 11B is data in which information D11b indicating the state of the wafer W is attached to an image G11b of the wafer W captured by the camera 210b. The image G11b of the wafer W is an image of a state where the wafer W is placed in the recessed portion 24 formed on the surface of the rotary table 2, and the end of the wafer W near to the rotary shaft 22 is warped upward and is positioned above the surface of the rotary table 2. The information D11b indicating the state of the wafer W is "Warped."

Figure 12A:
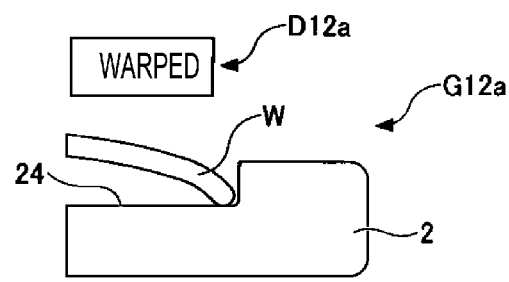
FIGS. 12A and 12B are views illustrating an example of training data.

The training data illustrated in FIG. 12A is data in which information D12a indicating the state of the wafer W is attached to an image G12a of the wafer W captured by the camera 210a. The image G12a of the wafer W is an image of a state where the wafer W is placed in the recessed portion 24 formed on the surface of the rotary table 2, and the center of the wafer W is warped upward and is positioned above the surface of the rotary table 2. The information D12a indicating the state of the wafer W is "Warped."

Figure 12B:
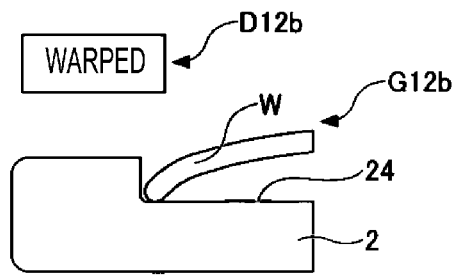

The training data illustrated in FIG. 12B is data in which information D12bindicating the state of the wafer W is attached to an image G12b of the wafer W captured by the camera 210b. The image G12b of the wafer W is an image of a state where the wafer W is placed in the recessed portion 24 formed on the surface of the rotary table 2, and the center of the wafer W is warped upward and is positioned above the surface of the rotary table 2. The information D12b indicating the state of the wafer W is "Warped."

Figure 13A:
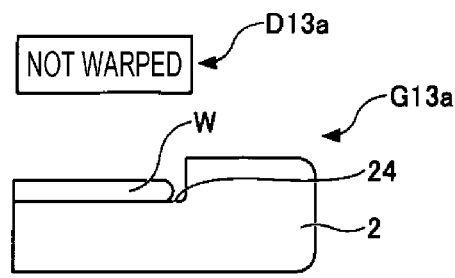
FIGS. 13A and 13B are views illustrating an example of training data.

The training data illustrated in FIG. 13A is data in which information D13a indicating the state of the wafer W is attached to an image G13a of the wafer W captured by the camera 210a. The image G13a of the wafer W is an image of a state where the wafer W is placed in the recessed portion 24 formed on the surface of the rotary table 2, and the end of the wafer W near to the conveyance port 15 is not warped. The information D13a indicating the state of the wafer W is "Not Warped."

Figure 13B:
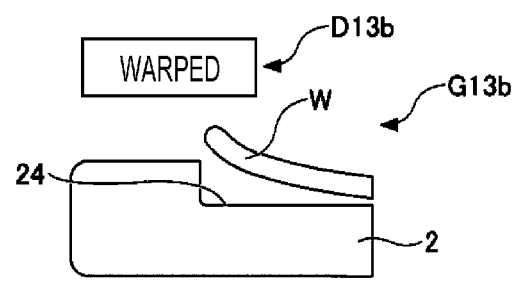

The training data illustrated in FIG. 13B is data in which information D13b indicating the state of the wafer W is attached to an image G13b of the wafer W captured by the camera 210b. The image G13b of the wafer W is an image of a state where the wafer W is placed in the recessed portion 24 formed on the surface of the rotary table 2, and the end of the wafer W near to the rotary shaft 22 is warped upward and is positioned above the surface of the rotary table 2. The information D13b indicating the state of the wafer W is "Warped."

Figure 14A:
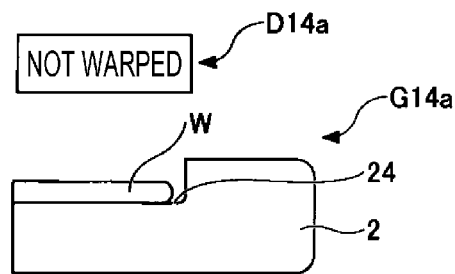
FIGS. 14A and 14B are views illustrating an example of training data.

The training data illustrated in FIG. 14A is data in which information D14a indicating the state of the wafer W is attached to an image G14a of the wafer W captured by the camera 210a. The image G14a of the wafer W is an image of a state where the wafer W is placed in the recessed portion 24 formed on the surface of the rotary table 2, and the end of the wafer W near to the conveyance port 15 is not warped. The information D14a indicating the state of the wafer W is "Not Warped."

Figure 14B:
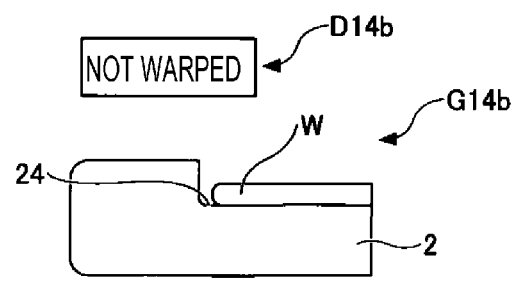

The training data illustrated in FIG. 14B is data in which information D14b indicating the state of the wafer W is attached to an image G14b of the wafer W captured by the camera 210b. The image G14b of the wafer W is an image of a state where the wafer W is placed in the recessed portion 24 formed on the surface of the rotary table 2, and the end of the wafer W near to the rotary shaft 22 is not warped. The information D14b indicating the state of the wafer W is "Not Warped."

Figure 15:
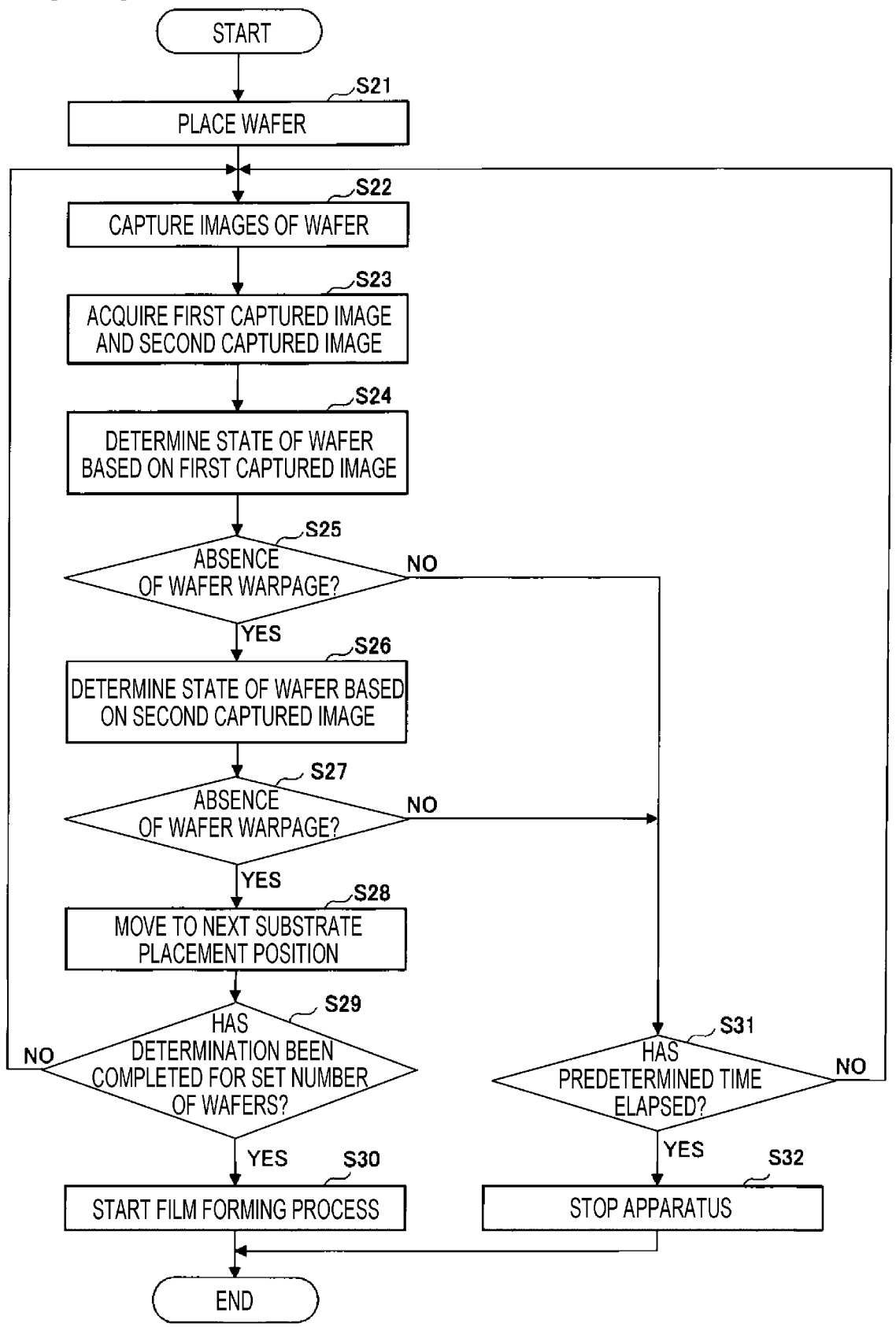
FIG. 15 is a flowchart illustrating an example of a substrate state determining process according to the second embodiment.

Next, as for a substrate state determining process (a substrate state determining method) of the second embodiment, descriptions will be made on, for example, a case where the substrate state determining apparatus 200A determines the state of the wafer W placed in the recessed portion 24 formed on the surface of the rotary table 2. FIG. 15 is a flowchart illustrating an example of the substrate state determining process according to the second embodiment.

In step S21, the wafer W is placed on the recessed portion 24 which is the substrate placement area on the rotary table 2. At this time, since the wafer W moves from a room temperature environment to a high temperature environment of, for example, about 400° C., the wafer W is largely warped upward due to the rapid temperature variance.

In step S22, the camera 210a captures an image of the recessed portion 24 and the wafer W near to the conveyance port 15, and the camera 210b captures an image of the recessed portion 24 and the wafer W near to the rotary shaft 22 (the center of the rotary table 2) (an image capturing step). In step S22, since images of only the end of the wafer W which is likely to cause the wafer W to fly out from the recessed portion 24 are obtained, the number of pixels of an image may be reduced, as compared with a case where an image of the entire lateral surface of the wafer W is captured. As a result, the time required for the determining step (step S24) to be described later may be reduced.

In step S23, the image of the wafer W captured by the camera 210a in step S22 (hereinafter, referred to as a "first captured image") and the image of the wafer W captured by the camera 210b in step S22 (hereinafter, referred to as a "second captured image") are transmitted to the arithmetic processing apparatuses 220a and 220b, respectively. Thus, the arithmetic processing apparatuses 220a and 220b acquire the first captured image and the second captured image, respectively.

In step S24, the arithmetic processing apparatus 220a determines the state of the wafer W corresponding to the first captured image by using the substrate state determination model (a determining step). The substrate state determination model is generated by executing the machine learning using the training data in which the information indicating the state of the wafer W is attached to the first captured image, and is a model in which the image of the wafer W is taken as an input and a value related to the state of the wafer W corresponding to the image of the wafer W is taken as an output. The substrate state determination model is generated by the learning unit 223 of the arithmetic processing apparatus 220a before the substrate state determining process is performed (a learning step). As for the machine learning, for example, a deep learning may be used. The training data includes at least one of a plurality of images different in brightness of the surface of the rotary table 2, a plurality of images different in film thickness of a film deposited on the rotary table 2, and a plurality of images different in temperature of the rotary table 2, similarly to the training data described above in the first embodiment. That state of the wafer W includes, for example, a state where the wafer W is warped and a state where the wafer W is not warped, similarly to the state of the wafer W described above in the first embodiment.

In step S25, the arithmetic processing apparatus 220a determines whether the rotary table 2 is warped, based on the state of the wafer W determined in step S24. When it is determined in step S25 that the rotary table 2 is not warped, the process proceeds to step S26.

In step S26, the arithmetic processing apparatus 220b determines the state of the wafer W corresponding to the second captured image by using the substrate state determination model (a determining step). The substrate state determination model is generated by executing the machine learning using the training data in which the information indicating the state of the wafer W is attached to the second captured image, and is a model in which the image of the wafer W is taken as an input and a value related to the state of the wafer W corresponding to the image of the wafer W is taken as an output. The substrate state determination model is generated by the learning unit 223 of the arithmetic processing apparatus 220b before the substrate state determining process is performed. As for the machine learning, for example, a deep learning may be used. The training data includes at least one of a plurality of images different in brightness of the surface of the rotary table 2, a plurality of images different in film thickness of a film deposited on the rotary table 2, and a plurality of images different in temperature of the rotary table 2. The state of the wafer W includes, for example, a state where the wafer W is warped and a state where the wafer W is not warped, similarly to the state of the wafer W described above in the first embodiment.

In step S27, the arithmetic processing apparatus 220b determines whether the rotary table 2 is warped, based on the state of the wafer W determined in step S26. When it is determined in step S27 that the rotary table 2 is not warped, the process proceeds to step S28.

In step S28, the rotary table 2 is slightly rotated such that the recessed portion 24 on which the next wafer W is placed moves to the position where the cameras 210a and 210b are able to capture images from the windows 18a and 18b.

In step S29, it is determined whether the determination of the rotatable state has been completed for a set number of wafers in the step for moving the wafer W. For example, when the rotary table 2 has five recessed portions 24 along the rotation direction, it is determined whether the determination of the state of the wafer W has been completed for five wafers W.

When it is determined in step S29 that the determination of the rotatable state has been completed for the set number of wafers, the process proceeds to step S8. Meanwhile, when it is determined in step S29 that the determination of the rotatable state has not been completed for the set number of wafers, the process returns to step S22, and the process of determining the state of the wafer W is repeated. A series of processes are repeated for each wafer W, and when the determination is completed for the set number of wafers, the process proceeds to step S30.

In step S30, the film forming process is started in the substrate processing apparatus 100A. Specifically, as described above in FIGS. 1 to 5, the rotation of the rotary table 2 is started, and the film forming process is performed. When a predetermined film forming process is completed, the process is ended.

Meanwhile, when it is determined in step S25 or S27 that the wafer W is warped, the process proceeds to step S31.

In step S31, it is determined whether a predetermined time has elapsed since the wafer W was placed on the recessed portion 24. The predetermined time is determined according to, for example, conditions of the film forming process.

When it is determined in step S31 that the predetermined time has not elapsed, the process returns to step S22, and the processes of steps S22 to S27 and S31 are repeated until the warpage of the wafer W is settled. Meanwhile, when it is determined in step S31 that the predetermined time has elapsed, the process proceeds to step S10.

In step S32, the arithmetic processing apparatuses 220a and 220b output an alarm signal to the controller 90, and the controller 90 stops the operation of the substrate processing apparatus 100A. As a result, the user of the substrate processing apparatus 100A may recognize an abnormality and check the state of the apparatus. In addition, the arithmetic processing apparatuses 220a and 220b may output an alarm signal to the display device 230, and the display device 230 may display the alarm.

As described above, according to the second embodiment, the determination unit 224 determines the state of the wafer W corresponding to the images of the wafer W captured by the cameras 210a and 210b, using the substrate state determination model generated by the machine learning executed by the learning unit 223 using the training data. As a result, the state of the wafer W placed on the rotary table 2 may be detected with a high accuracy. Thus, the adjustment of the cameras 210a and 210b becomes unnecessary. Further, since the possibility of a deviation of the wafer W due to an abnormality when the wafer W is placed on the rotary table 2 may be determined in real time, an apparatus trouble caused from the deviation of the wafer W may be suppressed in advance, and the apparatus may be stably operated. As a result, a yield or productivity is improved.

Meanwhile, in the embodiment described above, descriptions have been made on a case where after wafers W are placed on all of the plurality of recessed portions 24 formed on the rotary table 2, the substrate state determining process is performed on each wafer W. However, for example, the substrate state determining process may be performed each time a wafer W is placed on each recessed portion 24.

In addition, in the embodiment described above, descriptions have been made on a case where when the rotary table 2 is rotated such that the recessed portion 24 on which the wafer W is placed moves to the position where the cameras 210a and 210b are able to capture images from the windows 18a and 18b, the rotation of the rotary table 2 is stopped, and the cameras 210a and 210b capture images of the wafer W. However, the present disclosure is not limited thereto. For example, when the rotary table 2 is rotated such that the recessed portion 24 on which the wafer W is placed moves to the position where the cameras 210a and 210b are able to capture images from the windows 18a and 18b, the cameras 210a and 210b may capture images of the wafer W in a state of maintaining the rotation of the rotary table 2.

In the embodiment described above, the substrate processing apparatus is a semi-batch type apparatus in which the plurality of wafers W placed on the rotary table 2 are revolved by the rotary table 2, and sequentially pass the area where the source gas is supplied and the area where the reaction gas is supplied, such that a film is formed on the wafers. However, the substrate processing apparatus is not limited thereto and may be, for example, a sheet type apparatus that processes wafers one by one or a batch type vertical heat treatment apparatus that processes a plurality of wafers at one time.

In the embodiment described above, descriptions have been made on, for example, a case where the substrate is a wafer W. However, the present disclosure is not limited thereto. For example, the substrate may be a large substrate for a flat panel display (FPD) or a substrate for an EL element or a solar cell.

According to the present disclosure, the state of a substrate placed on a stage in a semiconductor manufacturing apparatus may be detected with a high accuracy.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate state determining apparatus comprising:
a memory; and
a processor coupled to the memory and configured to:
execute a machine learning using training data in which information indicating a state of a substrate is attached to an image of the substrate disposed in a recessed portion formed on a surface of a stage wherein the image is taken by a camera, thereby generating a substrate state determination model in which the image of the substrate is taken as an input and a value related to the state of the substrate corresponding to the image of the substrate is taken as an output; and
determine the state of the substrate corresponding to the image of the substrate captured by the camera, using the substrate state determination model generated by executing the machine learning,
wherein the training data includes:
a first image of a state where the substrate is placed in the recessed portion, and an entirety of an end of the substrate is warped upward and is present above the surface of the stage,
a second image of a state where the substrate is placed in the recessed portion, and a center of the substrate is warped upward and is present above the surface of the stage,
a third image of a state where the substrate is placed in the recessed portion, and a portion of the end of the substrate is warped upward and is present above the surface of the stage, and
a fourth image of a state where the substrate is not warped and an entirety of the substrate is present below the surface of the stage.

2. The substrate state determining apparatus according to claim 1, wherein the processor executes the machine learning by a deep learning.

3. The substrate state determining apparatus according to claim 1, wherein the training data includes at least one of a plurality of images different in brightness of the surface of the stage, a plurality of images different in film thickness of a film deposited on the stage, and a plurality of images different in temperature of the stage.

4. The substrate state determining apparatus according to claim 1, further comprising:
a display configured to display the image of the substrate captured by the camera in association with the state of the substrate corresponding to the image of the substrate that is determined by the processor.

5. The substrate state determining apparatus according to claim 1, wherein the memory stores the image of the substrate captured by the camera in association with the state of the substrate corresponding to the image of the substrate that is determined by the processor, and the processor executes the machine learning using the image of the substrate stored in association with the state of the substrate in the memory, thereby updating the substrate state determination model.

6. The substrate state determining apparatus according to claim 1, wherein the stage is rotatable, and the camera captures an image of the substrate in a state where the stage is being rotated.

7. The substrate state determining apparatus according to claim 1, wherein the camera captures an image of the substrate from a lateral side.

8. The substrate state determining apparatus according to claim 1, wherein the camera includes a plurality of cameras that capture images of different ends of the substrate from a lateral side.

9. A substrate processing apparatus comprising:
a processing container;
a stage that is rotatably accommodated in the processing container and has a recessed portion on a surface thereof; and
a substrate state determining circuit that determines a state of a substrate placed in the recessed portion of the stage,
wherein the substrate state determining circuit includes:
  a memory; and
  a processor coupled to the memory and configured to:
  execute a machine learning using training data in which information indicating a state of a substrate is attached to an image of the substrate disposed on the stage wherein the image is taken by a camera, thereby generating a substrate state determination model in which the image of the substrate is taken as an input and a value related to the state of the substrate corresponding to the image of the substrate is taken as an output; and
  determine the state of the substrate corresponding to the image of the substrate captured by the camera, using the substrate state determination model generated by executing the machine learning,
wherein the training data includes:
  a first image of a state where the substrate is placed in the recessed portion, and an entirety of an end of the substrate is warped upward and is present above the surface of the stage,
  a second image of a state where the substrate is placed in the recessed portion, and a center of the substrate is warped upward and is present above the surface of the stage,
  a third image of a state where the substrate is placed in the recessed portion, and a portion of the end of the substrate is warped upward and is present above the surface of the stage, and
  a fourth image of a state where the substrate is not warped and an entirety of the substrate is present below the surface of the stage.

10. The substrate processing apparatus according to claim 9, wherein the stage is rotatable and includes a plurality of recessed portions along a rotation direction.

11. The substrate processing apparatus according to claim 9, wherein the processing container includes a window through which the inside of the processing container is observed, and
the camera is provided outside the processing container and captures an image of the substrate from the window.

12. The substrate processing apparatus according to claim 9, further comprising:
a nozzle configured to supply a gas into the processing container,
wherein a film forming process is performed in the processing container.

13. The substrate processing apparatus according to claim 9, further comprising:
a heater configured to heat the substrate placed on the recessed portion.

14. A model generating apparatus comprising:
a memory; and
a processor coupled to the memory and configured to:
execute a machine learning using training data in which information indicating a state of a substrate is attached to an image of the substrate placed in a recessed portion formed on a surface of a stage, thereby generating a substrate state determination model in which the image of the substrate is taken as an input and a value related to the state of the substrate corresponding to the image of the substrate is taken as an output,
wherein the training data includes:
a first image of a state where the substrate is placed in the recessed portion, and an entirety of an end of the substrate is warped upward and is present above the surface of the stage,
a second image of a state where the substrate is placed in the recessed portion, and a center of the substrate is warped upward and is present above the surface of the stage,
a third image of a state where the substrate is placed in the recessed portion, and a portion of the end of the substrate is warped upward and is present above the surface of the stage, and
a fourth image of a state where the substrate is not warped and an entirety of the substrate is present below the surface of the stage.

15. A substrate state determining method comprising:
performing a learning by executing a machine learning using training data in which information indicating a state of a substrate is attached to an image of the substrate placed in a recessed portion formed on a surface of a stage, thereby generating a substrate state determination model in which the image of the substrate is taken as an input and a value related to the state of the substrate corresponding to the image of the substrate is taken as an output;
capturing an image of the substrate placed on the stage; and
determining the state of the substrate corresponding to the image of the substrate captured in the capturing an image, using the substrate state determination model generated in the performing a learning,
wherein the training data includes:
a first image of a state where the substrate is placed in the recessed portion, and an entirety of an end of the substrate is warped upward and is present above the surface of the stage,
a second image of a state where the substrate is placed in the recessed portion, and a center of the substrate is warped upward and is present above the surface of the stage,
a third image of a state where the substrate is placed in the recessed portion, and a portion of the end of the substrate is warped upward and is present above the surface of the stage, and a fourth image of a state where the substrate is not warped and an entirety of the substrate is present below the surface of the stage.

16. The substrate state determining method according to claim 15, wherein the stage is rotatable and includes a plurality of recessed portions on the surface thereof along a rotation direction, and the capturing an image and the determining the state are performed for each recessed portion after substrates are placed in all of the plurality of recessed portions.

17. The substrate state determining method according to claim 15, wherein the stage is rotatable and includes a plurality of recessed portions on the surface thereof along a rotation direction, and the capturing an image and the determining the state are performed for each recessed portion each time a substrate is placed in any one of the plurality of recessed portions.

\* \* \* \* \*